United States Patent
Chu et al.

(10) Patent No.: US 9,906,224 B1
(45) Date of Patent: Feb. 27, 2018

(54) SEMICONDUCTOR DEVICE TO DISPEL CHARGES AND METHOD FORMING THE SAME

(71) Applicant: Taiwan Semiconductor Manufacturing Co., Ltd., Hsinchu (TW)

(72) Inventors: Yu-Lin Chu, Hsinchu (TW); Hsi-Yu Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/475,305

(22) Filed: Mar. 31, 2017

Related U.S. Application Data
(60) Provisional application No. 62/449,670, filed on Jan. 24, 2017.

(51) Int. Cl.
| | |
|---|---|
| *H01L 21/8238* | (2006.01) |
| *H03K 19/0948* | (2006.01) |
| *H01L 27/092* | (2006.01) |
| *H01L 27/07* | (2006.01) |

(52) U.S. Cl.
CPC ..... *H03K 19/0948* (2013.01); *H01L 21/8238* (2013.01); *H01L 27/0727* (2013.01); *H01L 27/092* (2013.01)

(58) Field of Classification Search
CPC .......... H01L 21/8238; H01L 27/0727; H03K 19/0948; H03K 19/09482; H03K 19/09485; H03K 19/08487

USPC ............. 326/21, 26–27, 82–83, 86
See application file for complete search history.

(56) References Cited

U.S. PATENT DOCUMENTS

| | | | | |
|---|---|---|---|---|
| 5,111,075 A | * | 5/1992 | Ferry | H03K 19/00361 326/27 |
| 6,635,934 B2 | * | 10/2003 | Hidaka | H03K 19/0016 257/369 |
| 7,304,503 B2 | * | 12/2007 | Masleid | H03K 19/01721 326/23 |
| 7,969,191 B2 | * | 6/2011 | Nedalgi | H03K 19/0013 326/81 |
| 9,478,608 B2 | * | 10/2016 | Salcedo | H01L 29/0646 |
| 2002/0122280 A1 | * | 9/2002 | Ker | H01L 27/0262 361/56 |
| 2006/0291321 A1 | * | 12/2006 | Leung | G11C 8/08 365/230.06 |
| 2008/0258771 A1 | * | 10/2008 | Tachibana | H01L 27/0211 326/98 |
| 2012/0075137 A1 | * | 3/2012 | Tanizawa | H03M 1/0621 341/157 |

(Continued)

*Primary Examiner* — Jason M Crawford
(74) *Attorney, Agent, or Firm* — McClure, Qualey & Rodack, LLP

(57) ABSTRACT

The semiconductor device for fabricating an IC is provided. The semiconductor device includes a deep n-well (DNW), a first inverter, a second inverter, an electrical path, and a charge-dispelling device. The DNW is formed in a substrate. The first inverter is formed inside the DNW. The second inverter is formed in the substrate and outside the DNW. The electrical path is arranged between the first inverter and the second inverter. The charge-dispelling device is connected between the ground of the first inverter and the ground of the second inverter to develop a bypass path. The impedance of the bypass path is lower than the impedance of the electrical path.

20 Claims, 11 Drawing Sheets

(56) References Cited

U.S. PATENT DOCUMENTS

| | | | | |
|---|---|---|---|---|
| 2012/0300349 | A1* | 11/2012 | Abou-Khalil | H02H 9/046 361/56 |
| 2013/0256801 | A1* | 10/2013 | Yen | H01L 21/82387 257/357 |
| 2014/0362482 | A1* | 12/2014 | Huang | H02H 9/046 361/56 |
| 2017/0069616 | A1* | 3/2017 | Cai | H01L 27/0255 |

* cited by examiner

SEMICONDUCTOR DEVICE TO DISPEL CHARGES AND METHOD FORMING THE SAME

CROSS REFERENCE TO RELATED APPLICATIONS

This application claims the benefit of U.S. Provisional Application No. 62/449,670 filed on Jan. 24, 2017, the entirety of which is incorporated by reference herein.

BACKGROUND

The semiconductor integrated circuit (IC) industry has experienced rapid growth. Continuing advances in semiconductor manufacturing processes have resulted in semiconductor device structures with finer features and/or higher degrees of integration. Functional density (i.e., the number of interconnected devices per chip area) has generally increased while feature size (i.e., the smallest component that can be created using a fabrication process) has decreased. This scaling-down process and increased density of devices generally provide benefits by increasing production efficiency and lowering associated costs.

The increased density of devices in integrated circuits has generally increased the amount of noise in various circuits, as has the combination of various types of circuitry such as logic and radio-frequency processing circuits. Noise can be detrimental in integrated circuits because it can compromise the integrity of a signal, which can in turn cause a loss of data or errors in logic or signal processing.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
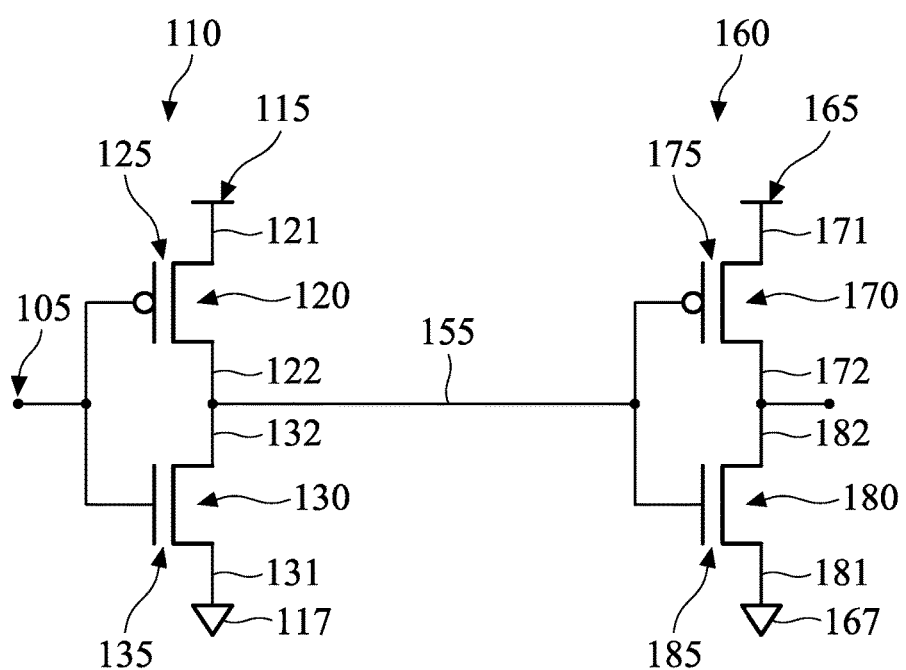
FIG. 1 is a circuit diagram of two inverters, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

Embodiments are generally described in the context of an integrated circuit. Embodiments may be applied to any integrated circuit, for example, a logic circuit, a static random access memory (SRAM), and the like.

FIG. 1 is a circuit diagram of two inverters 110 and 160, in accordance with some embodiments. As shown in FIG. 1, the semiconductor device 100 includes two inverters 110 160. The inverter 110 is made of a p-channel MOSFET transistor (or PMOS transistor) 120 and an n-channel MOSFET transistor (or NMOS transistor) 130. The PMOS transistor 120 has a source 121, a drain 122, and a gate 125. The source 121 is connected to a positive power supply (e.g., VDD) 115 and the drain 122 is connected to a drain 132 of the NMOS transistor 130.

The NMOS transistor 130 has a source 131, the drain 132, and a gate 135. The source 131 of the NMOS transistor 130 is connected to a ground 117. The gate 125 of the PMOS transistor 120 and the gate 135 of the NMOS transistor 130 are connected to a signal source 105. The inverter 160 is made of a PMOS transistor 170 and an NMOS transistor 180. The PMOS transistor 170 has a source 171, a drain 172, and a gate 175. The source 171 is connected to a positive power supply (e.g., VDD) 165 and the drain 172 is connected to a drain 182 of the NMOS transistor 180. The NMOS transistor 180 has a source 181, the drain 182, and a gate 185. The source 181 of the NMOS transistor 180 is connected to a ground 167. The gate 175 of the PMOS transistor 170 and the gate 185 of the NMOS transistor 180 are connected to a signal line 155 (the electrical path).

Figure 2:
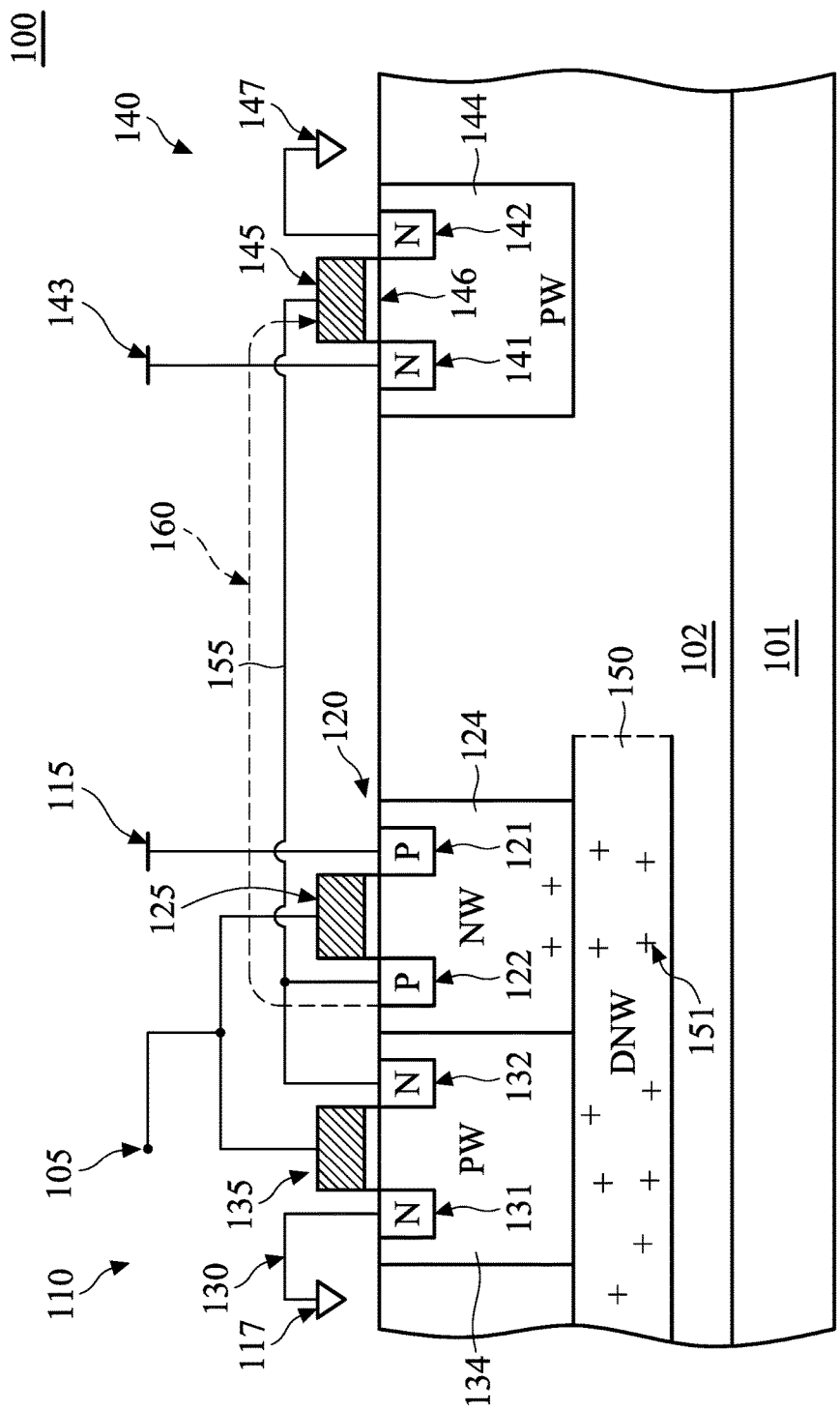
FIG. 2 is a cross-sectional view of a device portion of the inverter and an n-channel metal-oxide-semiconductor (NMOS) transistor, in accordance with some embodiments.

FIG. 2 is a cross-sectional view of a device portion of an inverter (e.g., inverter 110) and an NMOS transistor (e.g., NMOS transistor 140), in accordance with some embodiments. The inverter 110 and the NMOS transistor 140 are formed in and on a substrate 101 within a p-doped region 102. In some embodiments, there may be one or more additional layers between the p-doped region 102 and the substrate 101.

The source 141 and drain 142 (both are doped with n-type dopants) of the NMOS transistor 140 are formed in a p-well (or PW) 144. The source 121 and drain 122 (both are doped with p-type dopants) of the PMOS transistor 120 of the inverter 110 are formed in an n-well (or NW) 124. The source 131 and drain 132 (both are doped with n-type dopants) of the NMOS transistor 130 are formed in a p-well (or PW) 134. Both the n-well 124 and p-well 134 of the inverter 110 are formed over a deep n-well (or DNW) 150.

As mentioned above, noise can be detrimental in integrated circuits because it can compromise signal integrity. Devices in an integrated circuit are formed in a deep doped well, such as the DNW 150 described above, to isolate substrate noise. Deep doped wells refer to doped wells that are located lower (or deeper into the substrate) than the doped wells. The DNW 150 could surround transistors and/or other devices. The DNW 150 is typically able to reduce noise between other devices in the substrate and devices in the deep doped well by providing a low resistance path for the noise to travel to a ground node rather than affecting devices in the deep doped well. For example, devices for high speed applications, having mixed signals, or having radio frequency (RF) circuits are susceptible to noise interference. Therefore, such devices may employ the DNW 150 for noise reduction.

During the manufacturing of semiconductor devices, various plasma processes may be used in fabricating devices and interconnects for connecting these semiconductor devices. Plasma processes used in manufacturing devices may include, but are not limited to, reactive ion etch (RIE) used for removing materials on a semiconductor substrate, plasma-enhanced deposition for forming films, ion implantation for forming doped regions, and physical vapor deposition (PVD) for depositing conductive materials, etc. For example, high-density plasma (HDP) deposition may be used to deposit an inter-level dielectric (ILD) layer, or inter-metal dielectric (IMD) layer. Physical vapor deposition (PVD) that uses plasma discharge to sputter conductive materials off targets for depositing them on substrates to form contacts and vias in the ILD layers.

Plasma ions may directly contact a substrate surface and be implanted into the substrate. In addition, plasma ions may be transferred to a substrate indirectly. For example, plasma may be used to assist etching, such as in the case of reactive ion etch (RIE), to form openings or patterns in or on substrates. The openings generally extend to some underlying conductive feature, and the plasma used in the plasma process is able to contact the conductive feature and be transported into the substrate. In structures having devices having doped wells, charges from the plasma can be transferred through the conductive feature to the doped wells.

As mentioned above, many manufacturing processes involve plasma. If the substrate 101 is not grounded properly, ions in the plasma could accumulate in various layers in and/or on substrate 101. For example, during RIE, the substrate 101 is biased to attract positive etching ions to increase ion energy and etch rate. Improper substrate grounding accumulates positive ions in or on substrate 101, such as positive ions 151 in the DNW 150. The DNW 150 is a relatively large region in comparison to NW 124, PW134 and NW144. The DNW 150 could be utilized for blocking the path of the charges to the substrate 101 due to its reverse diode characteristic. Therefore, the charges will pass through the body diode of the NMOS transistor 130 inside the DNW 150 to damage the gate 145 outside the DNW 150.

In some embodiments, charges from the source 117 flow through the body diode of the NMOS transistor 130 to damage the gate 145. The above damage is different from the traditional CDM damage which is often observed in packaged chips resulting in field/line return. This above damage is named as CDM (Charged-Device Model)-like damage. The CDM-like damage has the same surface features as the CDM damage, and the CDM-like damage will be observed in wafer form. When a signal line 155 (an interconnect) between the gate 145 of the NMOS transistor 140 and the drain 122 of the PMOS transistor 120 is formed, the positive ions 151 could flow from the drain 122 to the gate 145 due to a voltage drop and could damage a gate dielectric 146 in the gate 145. A dotted line 160 indicates the flow of positive ions 151. A damaged gate dielectric 146 would make the performance of the NMOS transistor 140 inconsistent and uncontrollable. Therefore, the charges in the DNW 150 would degrade the yield of the transistor 140.

Figure 3A:
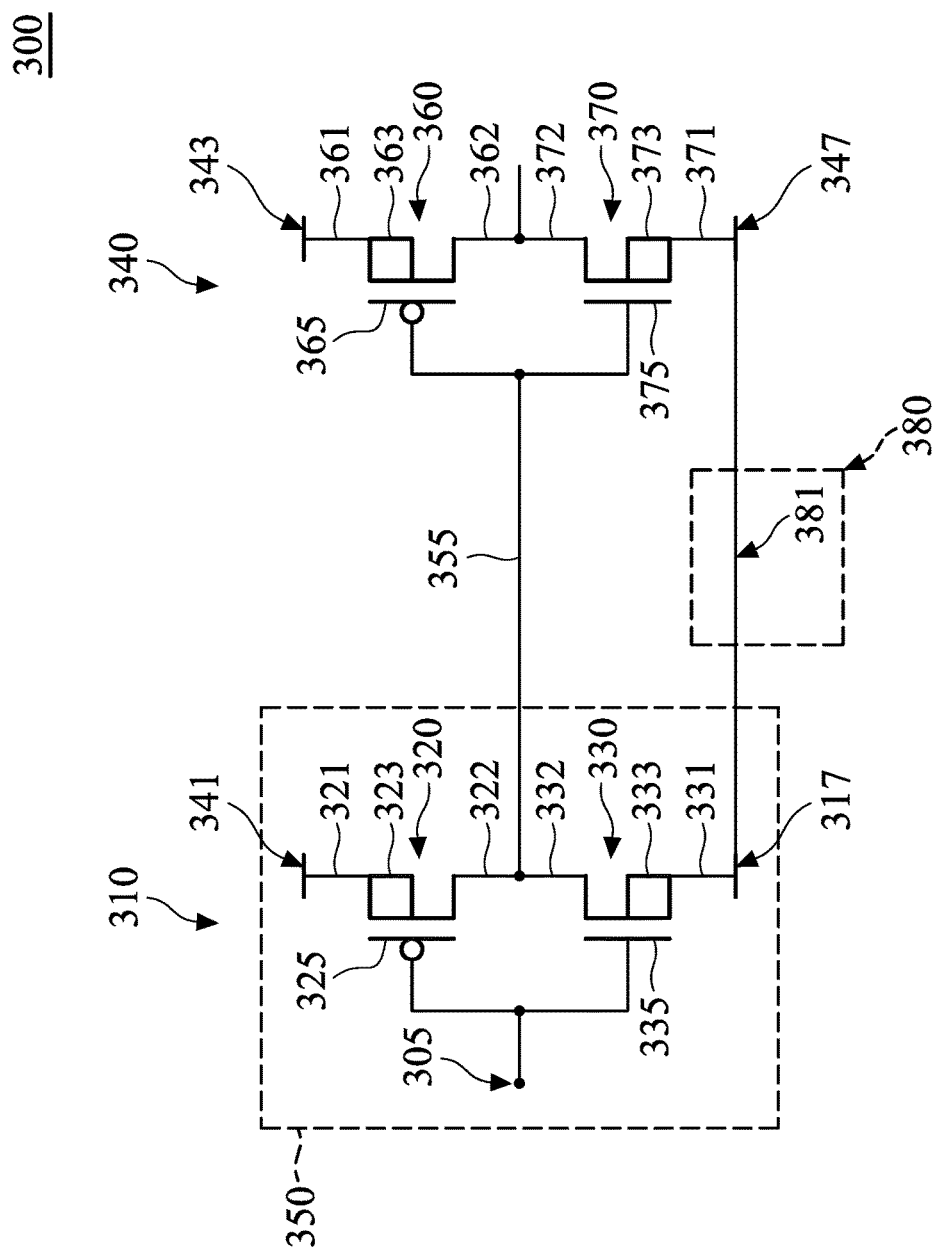
FIG. 3A is a circuit diagram of inverters and a charge-dispelling device, in accordance with some embodiments.

FIG. 3A is a circuit diagram of inverters 310 and 340 and a charge-dispelling device 380, in accordance with some embodiments. As shown in FIG. 3A, the semiconductor device 300 includes two inverters 310, 340 and a charge-dispelling device 380. The inverter 310 is formed inside the DNW 350. The two inverters 310 and 340 are connected by a signal line 355 (the electrical path) and a charge-dispelling device 380. In one embodiment, the charge-dispelling device 380 includes a metal line 380, which could be made of Cu, Al, Au or another metal material.

Specifically, the charge-dispelling device 380 is utilized to dispel charges generated by the manufacturing process, such as plasma. Accordingly, the semiconductor device 300 could be prevented from being damaged by the accumulated charges in the DNW 350.

The inverter 310 is made of a PMOS transistor 320 and an NMOS transistor 330. The PMOS transistor 320 has a source 321, a drain 322, a bulk 323 and a gate 325. The source 321 is connected to a positive power supply (e.g., VDD) 341 and the drain 322 is connected to a drain 332 of the NMOS transistor 330. The NMOS transistor 330 has a source 331, a drain 332, a bulk 333, and a gate 335. The source 331 of the NMOS transistor 330 is connected to a ground 317. The gate 325 of the PMOS transistor 320 and the gate 335 of the NMOS transistor 330 are connected to the signal source 305. The source 321 and the bulk 323 are connected together, and they are connected to the power supply (VDD) 341. The source 331 and the bulk 333 are connected together, and they are connected to the power supply (VSS) 317.

In addition, the inverter 340 is made of a PMOS transistor 360 and an NMOS transistor 370. The PMOS transistor 360 has a source 361, a drain 362, a bulk 363 and a gate 365. The source 361 is connected to a positive power supply (e.g., VDD) 343 and the drain 362 is connected to a drain 372 of the NMOS transistor 370. The NMOS transistor 370 has a source 371, a drain 372, a bulk 373, and a gate 375. The source 371 of the NMOS transistor 370 is connected to a ground 347. The gate 365 of the PMOS transistor 360 and the gate 375 of the NMOS transistor 370 are connected to the signal line 355. The source 361 and the bulk 363 are connected together, and they are connected to the power supply (VDD) 343. The source 371 and the bulk 373 are connected together, and they are connected to the power supply (VSS) 347.

It should be noted that the arrangement of the two inverters 310 and 340 are used for illustration, not for limiting the present disclosure. The present disclosure may be applied to any integrated circuit, for example, a logic circuit, a static random access memory (SRAM), and the like. For example, the semiconductor device 300 could include one inverter and one transistor, and the inverter and the transistor are connected by the signal line 355 and the charge-dispelling device 380.

Figure 3B:
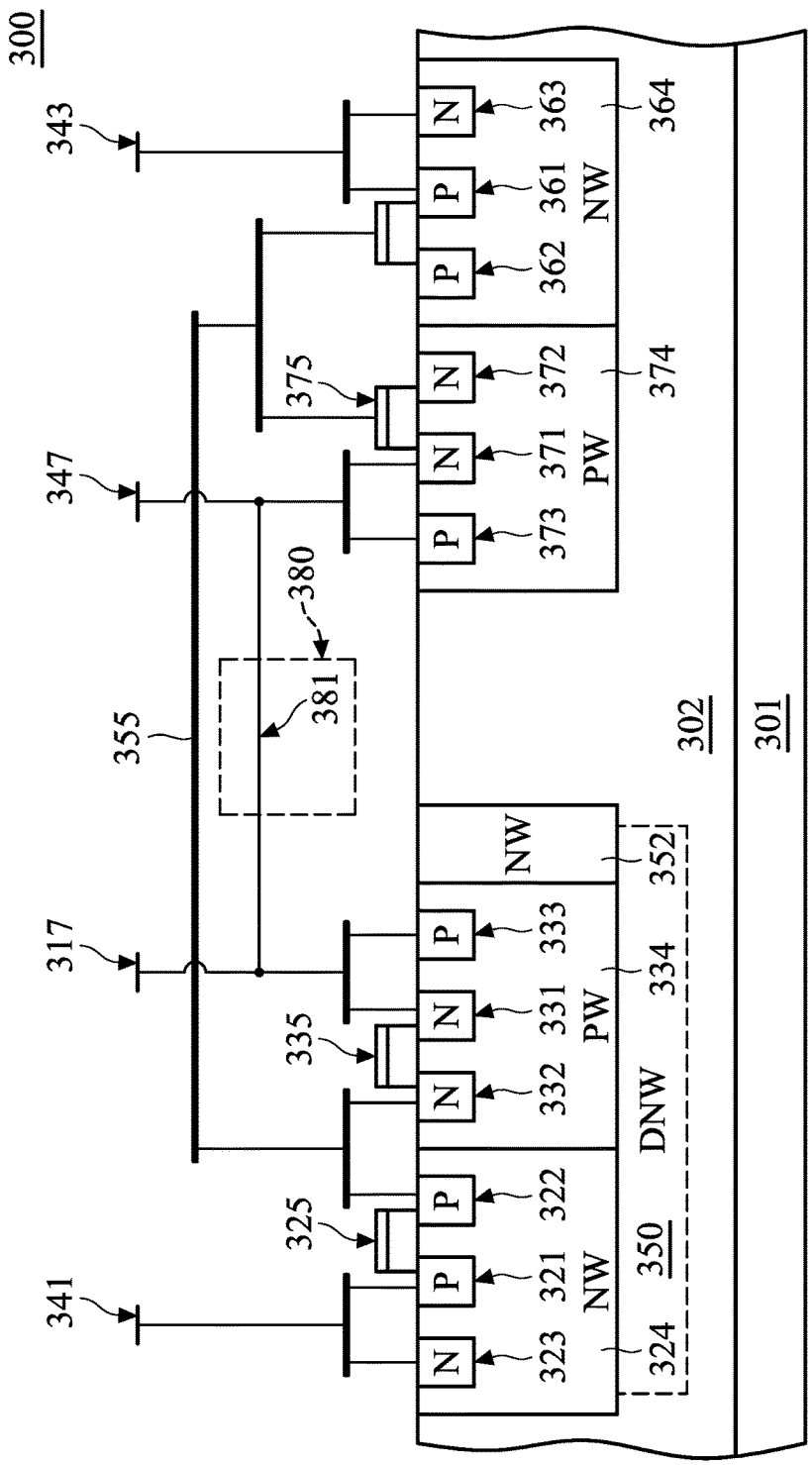
FIG. 3B is a cross-sectional view of inverters and a charge-dispelling device, in accordance with some embodiments.

FIG. 3B is a cross-sectional view of inverters 310 and 340 and a charge-dispelling device 380, in accordance with some embodiments. The inverters 310 and 340 are formed within a p-doped region 302, and the p-doped region 302 is on a substrate 301. In some embodiments, there are one or more additional layers between the p-doped region 302 and the substrate 301. The inverter 310 is formed within the DNW 350, and the inverter 340 is formed outside the DNW 350.

Regarding the inverter 310, the source 321 and drain 322 (both are doped with p-type dopants) and the bulk 323 (doped with an n-type dopant) of the PMOS transistor 320 of the inverter 310 are formed in an n-well (NW) 324. The source 331 and drain 332 (both are doped with n-type dopants) and the bulk 333 (doped with a p-type dopant) of the NMOS transistor 330 are formed in a p-well (or PW) 334. Another NW 352 is formed adjacent to the PW 334. The PW 334 is surrounded by the NW 324 and 352. The n-well 324 and p-well 334 of the inverter 310 and the NW 352 are formed over the DNW 350.

Regarding the inverter 340, the source 361 and drain 362 (both are doped with p-type dopants) and the bulk 363 (doped with an n-type dopant) of the PMOS transistor 360 of the inverter 340 are formed in an NW 364. The source 371 and drain 372 (both are doped with n-type dopants) and the bulk 373 (doped with a p-type dopant) of the NMOS transistor 370 are formed in a PW 374.

In some embodiments, the charge-dispelling device 380 is connected between the bulk 333 of the NMOS transistor 330 and the bulk 373 of the NMOS transistor 370 to develop a bypass path. Specifically, most of the charges of the DNW 350 pass through the parasitic diode which is between the drain 332 and the body 333 of the NMOS transistor 330. The charge-dispelling device 380 connected to the body 333 could provide an efficient routs for draining and dissipating the charges that accumulate in the DNW 350. In other words, the charge-dispelling device 380 provided by the disclosure could be utilized to dispel charges of the DNW 350 which are generated in the manufacturing process.

In addition, the body 333 is the ground of the inverter 310 due to its low voltage. Similarly, the body 373 is the ground of inverter 340. In some embodiments, the charge-dispelling device 380 is connected between the ground of inverter 310 and the ground of inverter 340 to develop a bypass path. Accordingly, the ground of inverter 310 and that of inverter 340 are connected. Since the inverter 340 is not formed within the DNW 350, charges could flow from the ground of the inverter 340 to the substrate 301 without the blocking of the DNW 350. By establishing a bypass path between the two grounds of the inverters, the charges accumulated in the DNW 350 could be dissipated from the DNW 350, through the grounds of inverters 310 and 340, and to the substrate 301.

Figure 4A:
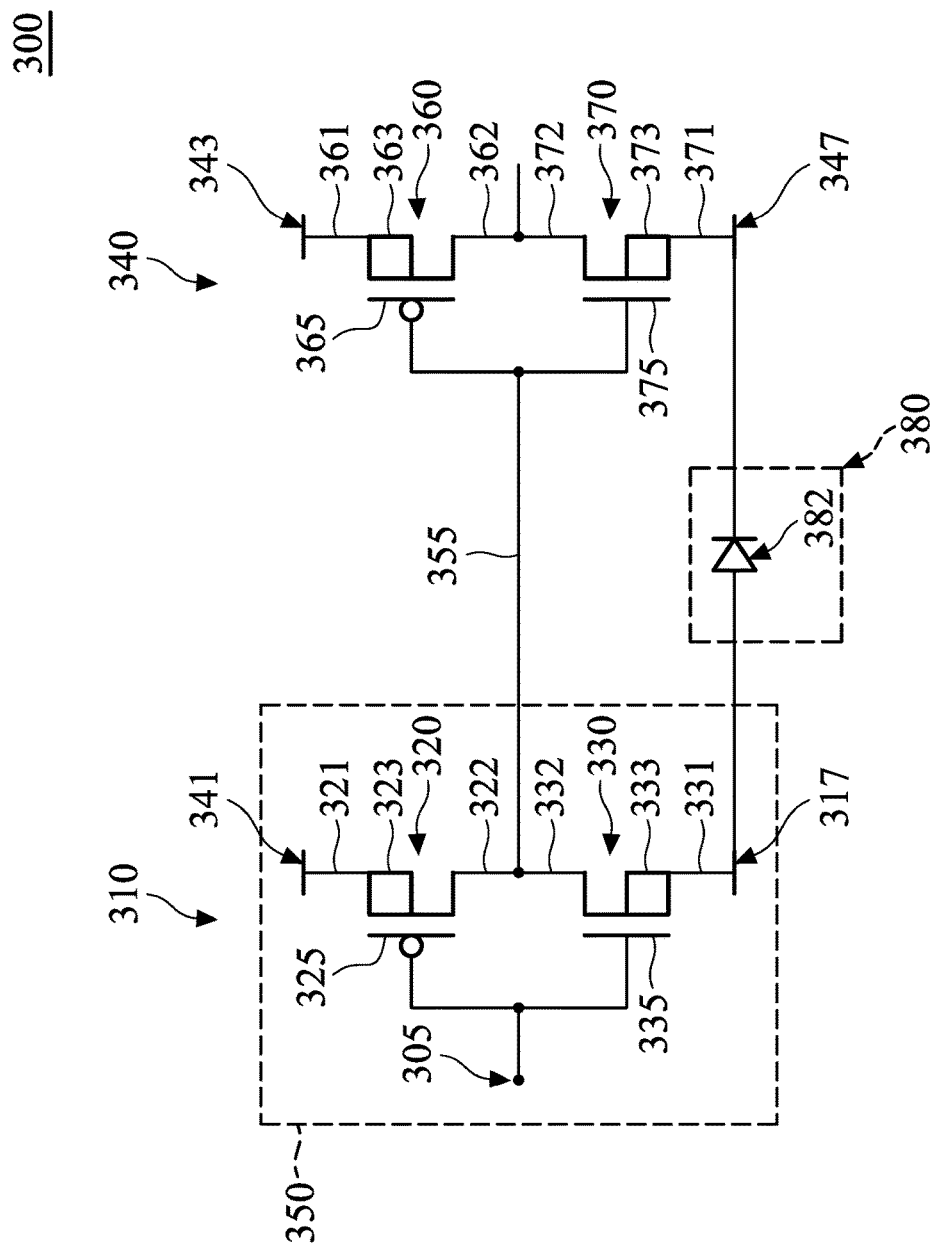
FIG. 4A is a circuit diagram of inverters and another kind of charge-dispelling device, in accordance with some embodiments.

FIG. 4A is a circuit diagram of inverters and another kind of charge-dispelling device 380, in accordance with some embodiments. Most of the arrangements of FIG. 4A are the same as the embodiments of FIG. 3A. However, in the embodiment of FIG. 4A, the charge-dispelling device 380 includes a diode 382. Specifically, as shown in FIG. 4A, the anode (p-doped region) of the diode 382 is connected to the source 331 of the NMOS transistor 330, and an cathode (n-doped region) of the diode 382 is connected to the source 371 of the NMOS transistor 370.

Specifically, the p-doped region of the diode 382 is the p-doped region 302, and the n-doped region of the diode 382 is formed in the p-doped region 302. In other embodiments, another well is formed within the p-doped region 302 which could be n-doped or p-doped. The n-doped region and the p-doped region of the diode 382 are formed within the well.

Figure 4B:
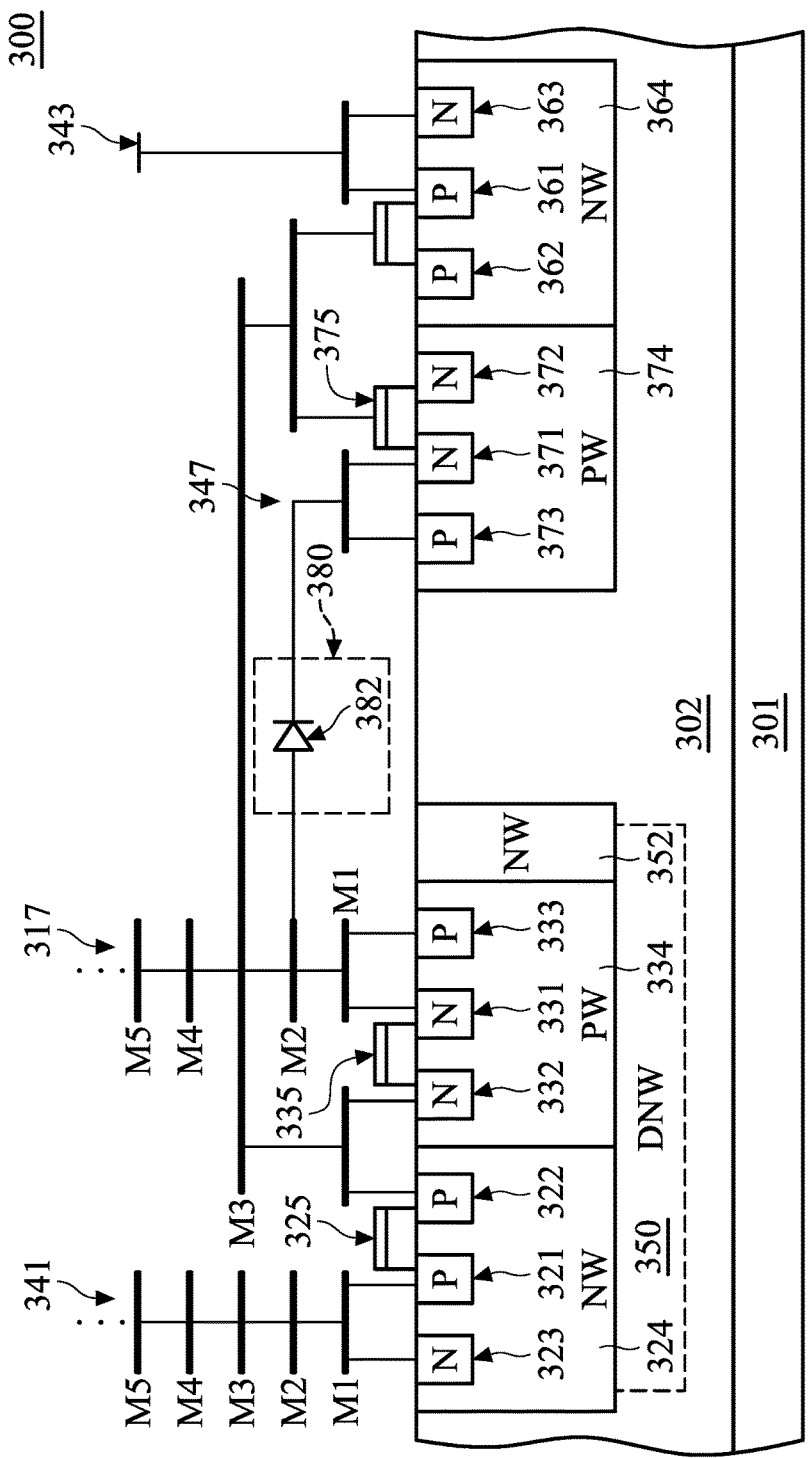
FIG. 4B is a cross-sectional view of inverters and another kind of charge-dispelling device, in accordance with some embodiments.

FIG. 4B is a cross-sectional view of inverters 310 and 340 and another kind of charge-dispelling device 380, in accordance with some embodiments. The voltage supplies 317 and 341 are illustrated as antennas for providing specific voltage levels, and the antenna could include a plurality of metal layers. As shown in FIG. 4B, each of the voltage supplies 317 and 341 includes five metal layers M1~M5.

In some embodiments, the bypass path is at the same metal level or at a lower metal level than the electrical path (i.e., the signal line 355). As shown in FIG. 4B, the signal line 355 is arranged in the metal layer M3, and the bypass path established by the diode 382 is arranged in the metal layer M2 which is lower than the metal layer M3. Therefore, the impedance of the bypass path is lower than impedance of the signal line 355. The charges of the DNW 350 mainly pass through the bypass path of the charge-dispelling device 380.

Furthermore, the turn-on voltage of the diode 382 (approximately 0.7V) is usually lower than the tunneling voltage of gate dielectric of the gate 375 of the NMOS transistor 370. The charges of the DNW 350 have more of a tendency to flow along the diode 381 than to pass through the gate dielectric of the gate 375 of the NMOS transistor 370. In other words, the impedance of the bypass path is lower than the impedance of the signal line 355. Therefore, the charge-dispelling device 380 could be utilized to dispel charges of the DNW 350 which are generated in the manufacturing process, such as plasma.

In addition, the turn-on voltage of the diode 382 could be a barrier to isolate noise of the semiconductor device 300. When the amplitude of the noise generated by the inverter 310 is lower than the turn-on voltage, it will be blocked by the diode 382. Therefore, the diode 382 can prevent the inverter 340 from being affected by the noise of the inverter 310.

Figure 5A:
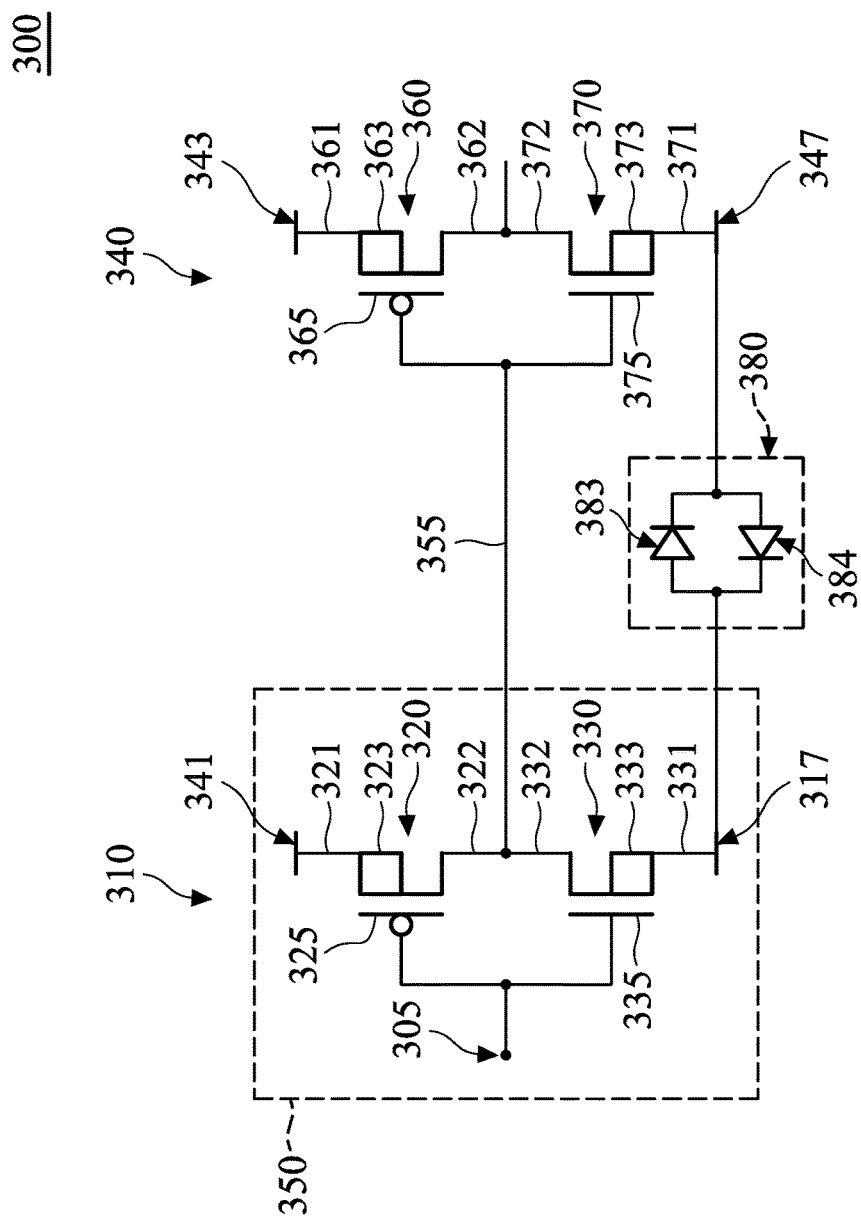
FIG. 5A is a circuit diagram of inverters and another kind of charge-dispelling device, in accordance with some embodiments.

FIG. 5A is a circuit diagram of inverters 310 and 340 and another kind of charge-dispelling device 380, in accordance with some embodiments. Most of the arrangements of FIG. 5A are the same as the embodiments of FIG. 4A. However, in the embodiment of FIG. 5A, the charge-dispelling device 380 includes two diodes 383 and 384. Specifically, the two diodes 383 and 384 are connected to each other. The diode 384 is connected in parallel with the diode 383.

As shown in FIG. 5A, the two diodes 383 and 384 are arranged back-to-back. Specifically, the anode (p-doped region) of the diode 383 is connected to the source 331 of the NMOS transistor 330, and a cathode (n-doped region) of the diode 384 is connected to the source 371 of the NMOS transistor 370. In addition, the n-doped region of the diode 384 is connected to the source 331 of the NMOS transistor 330, and a p-doped region of the diode 384 is connected to the source 371 of the NMOS transistor 370.

Figure 5B:
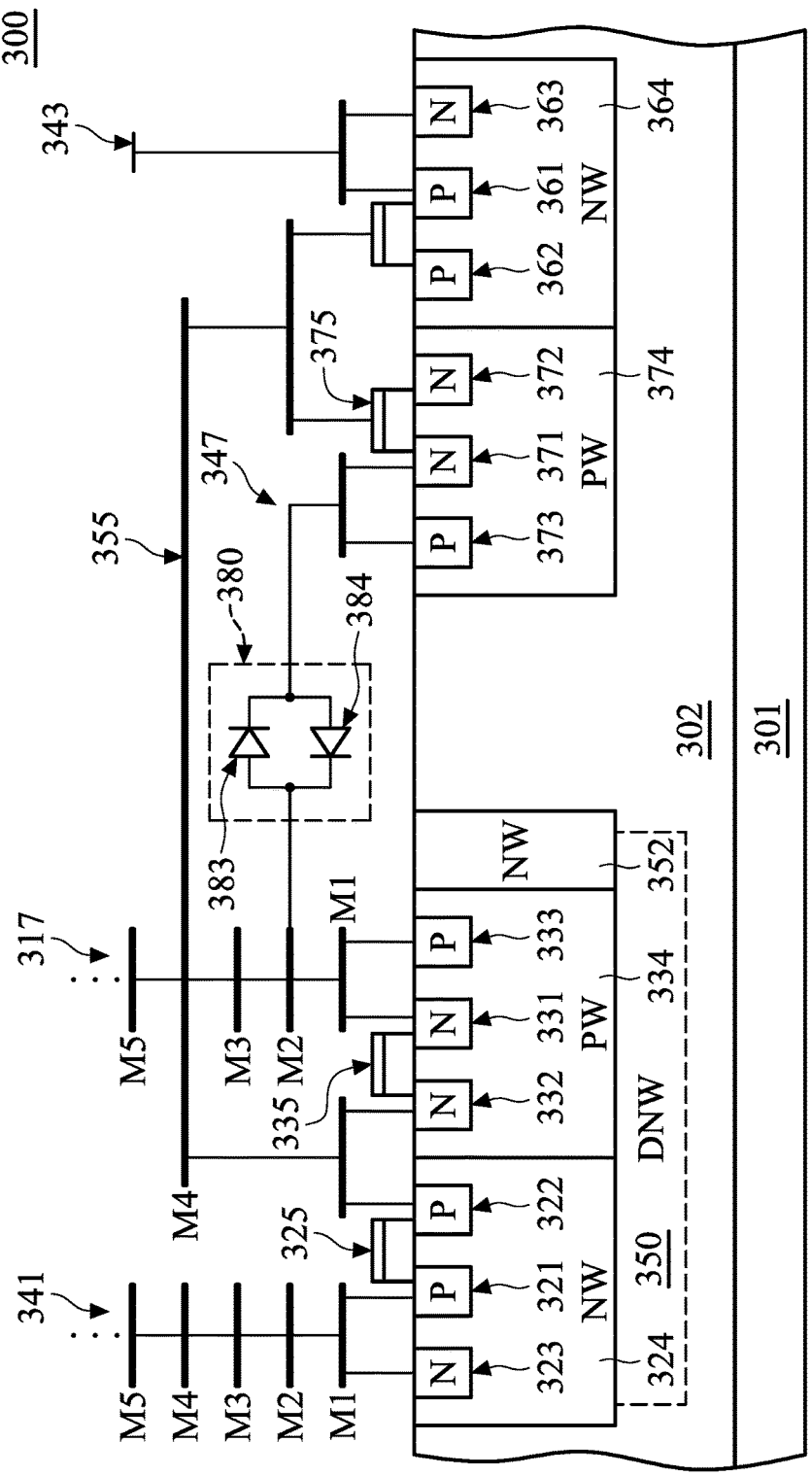
FIG. 5B is a cross-sectional view of inverters and another kind of charge-dispelling device, in accordance with some embodiments.

FIG. 5B is a cross-sectional view of inverters 310 and 340 and another kind of charge-dispelling device 380, in accordance with some embodiments. Since the charge-dispelling device 380 includes two diodes 383 and 384 which are positioned back-to-back, the turn-on voltage of the diode 384 could be a barrier to isolate noise from the semiconductor device 300. When the amplitude of the noise generated by the inverter 340 is lower than the turn-on voltage, it will be blocked by the diode 384. The diode 384 can prevent the inverter 310 from being affected by the noise of the inverter 340. Noise from different directions could be prevented by the two diodes 383 and 340 of FIGS. 5A and 5B.

It should be noted that, although the CDM-like damage caused by the charges of the DNW 350 could be avoided by the diode 383, there are also other kinds of damage. For example, charges could be generated during the package process for the semiconductor device 300, or be generated during the movement of the semiconductor device 300. The flow paths of these kinds of charges may be different from the CDM-like charges. However, the diode 384 could be utilized to prevent other kinds of damage, since it is arranged opposite to the diode 383. Therefore, solid protection could be obtained by the two diodes 383 and 384 of FIGS. 5A and 5B.

Furthermore, the signal line 355 is arranged in the metal layer M4, and the bypass path established by the diodes 383 and 384 is arranged in the metal layer M2 which is lower than the metal layer M4. It should be noted that the diodes 383 and 384 are formed within the p-doped region 302 on the substrate 301. Because bypass path is at the same metal level or at a lower metal level than the electrical path, the impedance of the bypass path is lower than impedance of the signal line 355. Therefore, the charges of the DNW 350 mainly pass through the bypass path of the charge-dispelling device 380 rather than the signal path 355.

In other embodiments, the inverter 310 could be connected to more than two inverters. Accordingly, the signal paths will increase. However, because the charge-dispelling device 380 is arranged in the grounds of the inverters, only one bypass path established by the charge-dispelling device 380 is needed regardless of the number of inverters. No matter how many electrical circuits the inverter 310 is connected to, there is no need to increase the number of charge-dispelling devices 380. Therefore, there is no extra cost or area penalty.

Figure 6A:
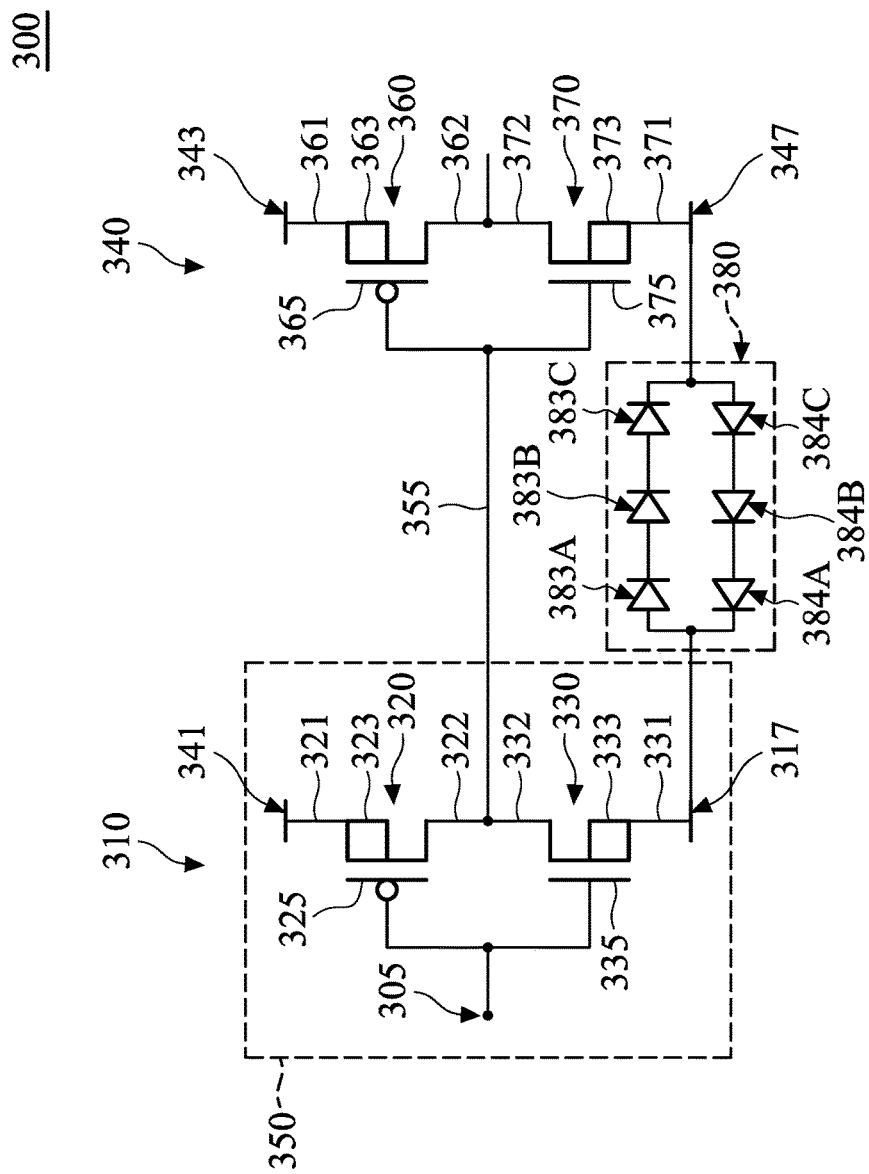
FIG. 6A is a circuit diagram of inverters and another kind of charge-dispelling device, in accordance with some embodiments.
Figure 6B:
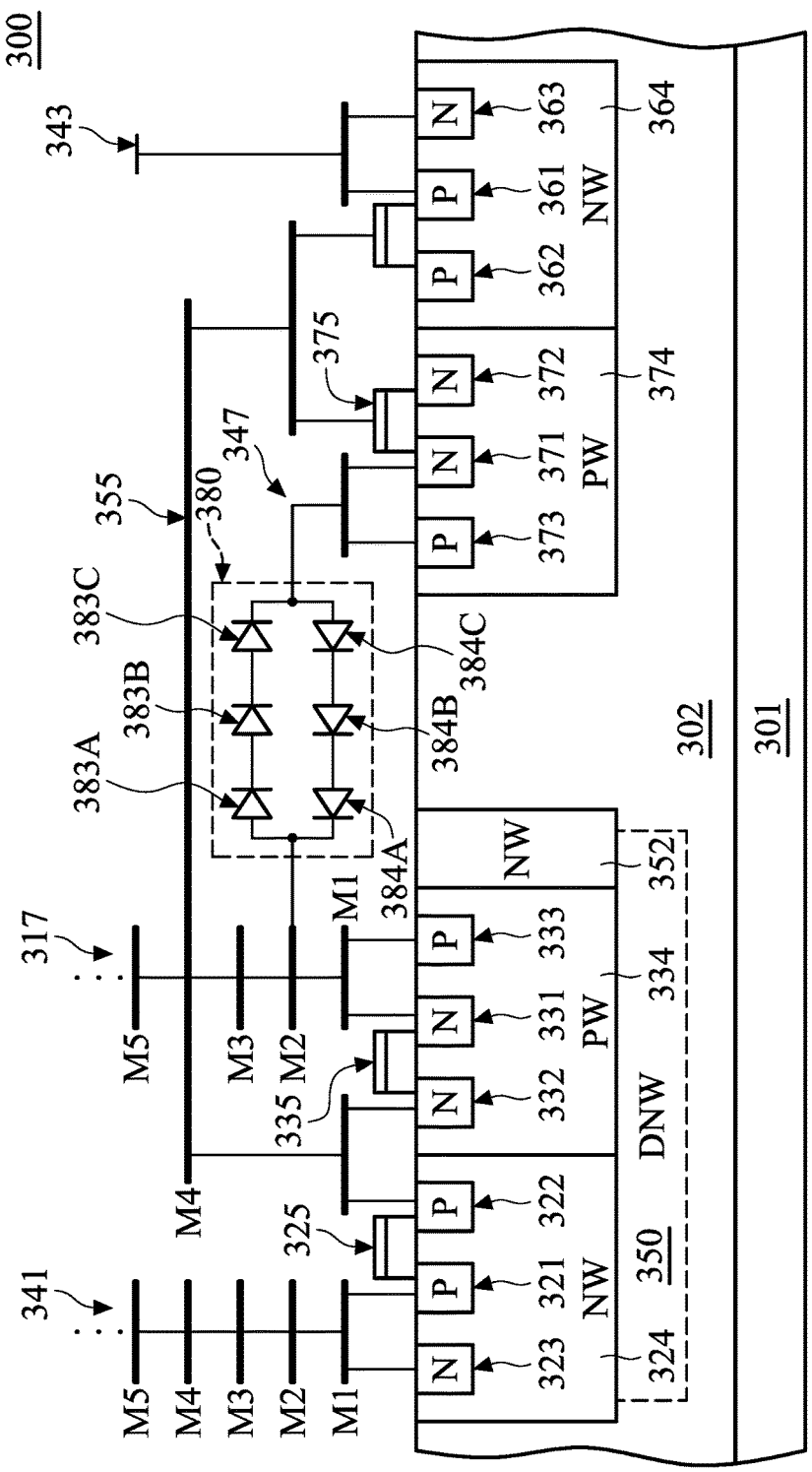
FIG. 6B is a cross-sectional view of inverters and another kind of charge-dispelling device, in accordance with some embodiments.

FIG. 6A is a circuit diagram of inverters 310 and 340 and another kind of charge-dispelling device 380, and FIG. 6B is a cross-sectional view of inverters 310 and 340 and another kind of charge-dispelling device 380, in accordance with some embodiments. Most of the arrangements of FIGS. 6A and 6B are the same as the embodiments of FIGS. 5A and 5B. However, in the embodiment of FIGS. 6A and 6B, the charge-dispelling device 380 includes a plurality of diodes 383A-383C and 384A-384C. The diodes 383A-383C are connected in parallel with the diodes 384A-384C. Diodes 383A-383C are connected in series with each other, and diodes 384A-384C are connected in series with each other.

The p-doped region of each of diodes 383A-383C is facing the source 331 of the NMOS transistor 330, and the n-doped region of each of diodes 383A-383C is facing the source 371 of the NMOS transistor 370. In addition, the anode (n-doped region) of each of diodes 384A-384C is facing the source 331 of the NMOS transistor 330, and the cathode (p-doped region) of each of diodes 384A-384C is facing the source 371 of the NMOS transistor 370. It should be noted that the number of diodes 383A-384C is used for illustration, not for limiting the present disclosure.

It should be noted that the turn-on voltages of diodes 383A-384C could be a barrier to isolating noise in the semiconductor device 300. When the noise becomes severe or high, a barrier with high turn-on voltages will be required. The turn-on voltage could be increased by connecting several diodes in series. Therefore, the number of diodes included by the charge-dispelling device 380 is proportional to the amplitude of the noise.

However, the total turn-on voltage of diodes 383A-383C or 384A-384C should be lower than the tunneling voltage of the gate dielectric of the gate 375 of the NMOS transistor 370. As such, the impedance of the bypass path is lower than the impedance of the signal line 355. The charges of the DNW 350 have more of a tendency to flow along the charge-dispelling device 380 than to pass through the gate dielectric of the gate 375 of the NMOS transistor 370, and the charge-dispelling device 380 may be utilized to dispel charges in the DNW 350.

Figure 7:
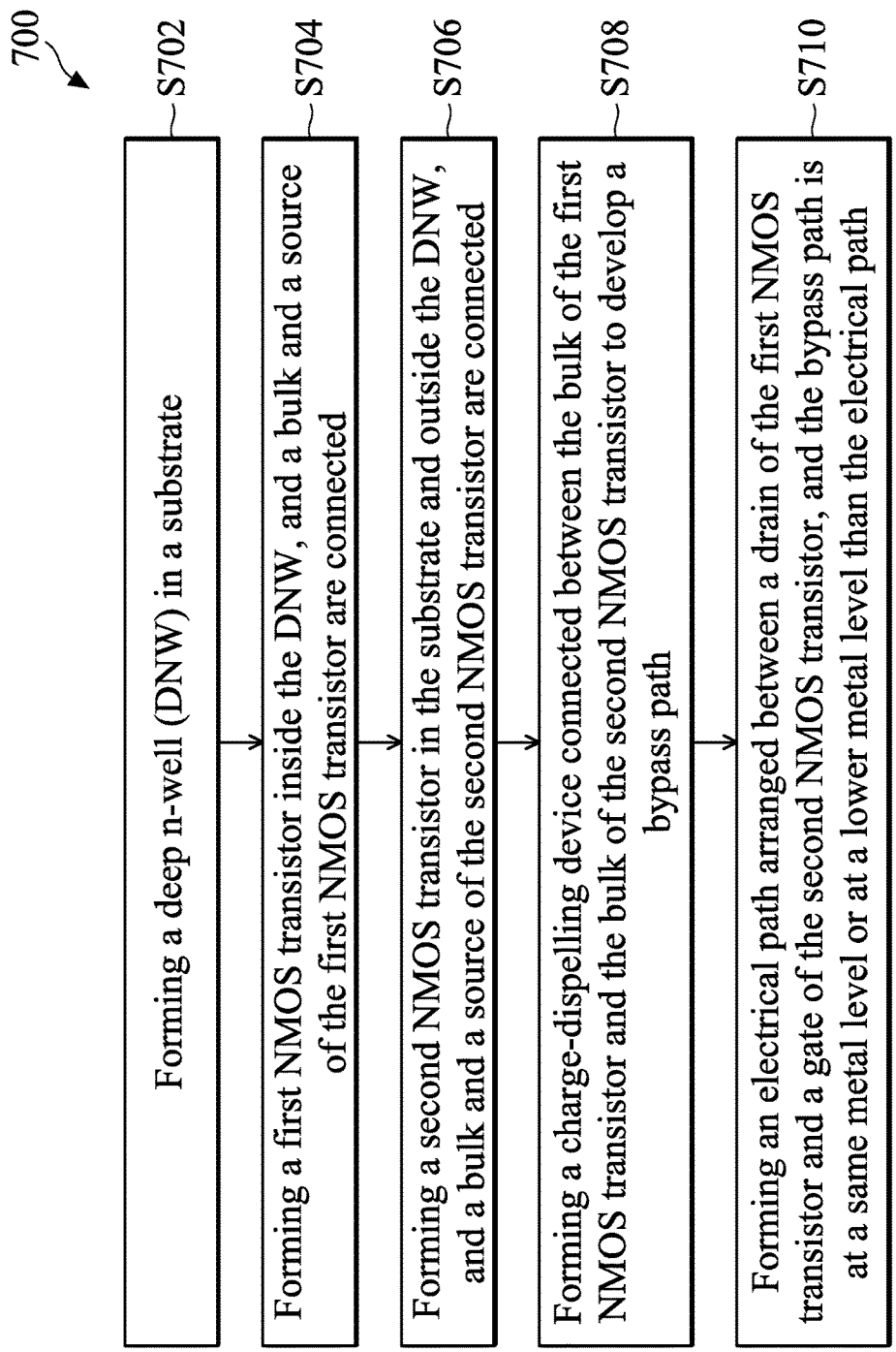
FIG. 7 is a flow chart of a method illustrating process flows for preparing device structures, in accordance with some embodiments.

FIG. 7 is a flow chart of a method 700 illustrating process flows for preparing device structures, in accordance with some embodiments. In operation S702, a DNW 350 is formed in the substrate 301. In operation S704, an NMOS transistor 330 is formed inside the DNW 350, and the bulk 333 and source 331 of the NMOS transistor 330 are connected. In operation S706, the NMOS transistor 370 is formed in the substrate 301 and outside the DNW 350, and the bulk 373 and source 371 of the NMOS transistor 370 are connected.

Afterwards, in operation S708, a charge-dispelling device 380 is formed and connected between the bulk 333 of NMOS transistor 330 and the bulk 373 of NMOS transistor 370 to develop a bypass path. In operation S710, an electrical path is arranged between the drain 332 of NMOS transistor 330 and the gate 375 of NMOS transistor 370, and the bypass path is at the same metal level or at a lower metal level than the electrical path. The charge-dispelling device 380 is utilized to dispel and dissipate the charges which accumulate in the DNW 350. These details have been illustrated before, and will not be repeated.

In some embodiments, the operations and/or functions are realized as functions of a program stored in a non-transitory computer-readable recording medium. Examples of a non-transitory computer-readable recording medium include, but are not limited to, an external/removable and/or internal/built-in storage or memory unit, e.g., one or more of an optical disk, such as a DVD, a magnetic disk, such as a hard disk, or a semiconductor memory, such as a ROM, a RAM, a memory card, and the like.

The charge-dispelling device of the disclosure connects to the ground of the electrical circuit to provide an efficient route for draining and dissipating the charges that accumulate in the DNW. In other words, the charge-dispelling device could be utilized to dispel charges in the DNW which are generated during the manufacturing process. In addition, the turn-on voltage of the charge-dispelling device could be a barrier to isolating the noise of the semiconductor device. The charge-dispelling device can prevent the electrical circuits from being affected by one another.

In accordance with some embodiments, a semiconductor device for fabricating an IC is provided. The semiconductor device includes a deep n-well (DNW), a first inverter, a second inverter, an electrical path, and a charge-dispelling device. The DNW is formed in a substrate. The first inverter is formed inside the DNW. The second inverter is formed in the substrate and outside the DNW. The electrical path is arranged between the first inverter and the second inverter. The charge-dispelling device is connected between the ground of the first inverter and the ground of the second inverter to develop a bypass path. The impedance of the bypass path is lower than the impedance of the electrical path.

In accordance with some embodiments, a semiconductor device for fabricating an IC is provided. The semiconductor device includes a deep n-well (DNW), a first NMOS transistor, a second NMOS transistor, and a charge-dispelling device. The DNW is formed in a substrate. The first NMOS transistor is formed inside the DNW. The bulk and the source of the first NMOS transistor are connected. The second NMOS transistor is formed in the substrate and outside the DNW. The bulk and the source of the second NMOS transistor are connected. The charge-dispelling device is connected between the bulk of the first NMOS transistor and the bulk of the second NMOS transistor to develop a bypass path.

In accordance with some embodiments, a method of forming a semiconductor device of an integrated circuit (IC) is provided. The method includes forming a deep n-well (DNW) in a substrate; forming a first n-channel metal-oxide-semiconductor (NMOS) transistor inside the DNW; forming a second NMOS transistor in the substrate and outside the DNW; and forming a charge-dispelling device. The bulk and the source of the first NMOS transistor are connected. The bulk and the source of the second NMOS transistor are connected. The charge-dispelling device is connected between the bulk of the first NMOS transistor and the bulk of the second NMOS transistor to develop a bypass path.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device of an integrated circuit (IC), comprising:
   a deep n-well (DNW) in a substrate;
   a first inverter formed inside the DNW;
   a second inverter formed in the substrate and outside the DNW;
   an electrical path, arranged between the first inverter and the second inverter; and
   a charge-dispelling device, connected between ground of the first inverter and ground of the second inverter to develop a bypass path, wherein impedance of the bypass path is lower than impedance of the electrical path.

2. The semiconductor device as claimed in claim 1, wherein the bypass path is at the same metal level or at a lower metal level than the electrical path, and the electrical path is arranged between drain of a first n-channel metal-oxide-semiconductor (NMOS) transistor of the first inverter and gate of a second NMOS transistor of the second inverter.

3. The semiconductor device as claimed in claim 2, wherein the ground of the first inverter is bulk of the first NMOS transistor, the ground of the second inverter is bulk of the second NMOS transistor, the bulk and a source of the first NMOS transistor are connected, and the bulk and a source of the second NMOS transistor are connected.

4. The semiconductor device as claimed in claim 1, wherein the charge-dispelling device comprises a first diode, an anode of the first diode is connected to the ground of the first inverter, and a cathode of the first diode is connected to the ground of the second inverter.

5. The semiconductor device as claimed in claim 4, wherein the charge-dispelling device further comprises a second diode in parallel with the first diode, an anode of the second diode is connected to the ground of the second inverter, and a cathode of the second diode is connected to the ground of the first NMOS transistor.

6. The semiconductor device as claimed in claim 5, wherein the charge-dispelling device further comprises at least one additional diode, the additional diode is in series with the first diode or in series with the second diode.

7. The semiconductor device as claimed in claim 6, wherein the charge-dispelling device further comprises two additional diodes, and the two additional diodes are in series with the first diode.

8. The semiconductor device as claimed in claim 6, wherein the charge-dispelling device further comprises two additional diodes, and the two additional diodes are in series with the second diode.

9. The semiconductor device as claimed in claim 1, wherein the charge-dispelling device comprises a metal line.

10. The semiconductor device as claimed in claim 1, wherein the electrical path comprises a metal line.

11. A semiconductor device of an integrated circuit (IC), comprising:
    a deep n-well (DNW) in a substrate;
    a first n-channel metal-oxide-semiconductor (NMOS) transistor formed inside the DNW, wherein a bulk and a source of the first NMOS transistor are connected;
    a second NMOS transistor formed in the substrate and outside the DNW, wherein a bulk and a source of the second NMOS transistor are connected; and
    a charge-dispelling device, connected between the bulk of the first NMOS transistor and the bulk of the second NMOS transistor to develop a bypass path.

12. The semiconductor device as claimed in claim 11, wherein the semiconductor device further comprises an electrical path, arranged between a drain of the first NMOS transistor and a gate of the second NMOS transistor, and impedance of the bypass path is lower than impedance of the electrical path.

13. The semiconductor device as claimed in claim 12, wherein the bypass path is at the same metal level or at a lower metal level than the electrical path.

14. The semiconductor device as claimed in claim 11, wherein the charge-dispelling device comprises a first diode, a p-doped region of the first diode is connected to the source of the first NMOS transistor, and an n-doped region of the first diode is connected to the source of the second NMOS transistor.

15. The semiconductor device as claimed in claim 14, wherein the charge-dispelling device further comprises a second diode in parallel with the first diode, a p-doped region of the second diode is connected to the source of the second NMOS transistor, and an n-doped region of the second diode is connected to the source of the first NMOS transistor.

16. The semiconductor device as claimed in claim 15, wherein the charge-dispelling device further comprises at least one additional diode, and the additional diode is in series with the first diode or in series with the second diode.

17. The semiconductor device as claimed in claim 16, wherein the charge-dispelling device further comprises two additional diodes, and the two additional diodes are in series with the first diode.

18. The semiconductor device as claimed in claim 16, wherein the charge-dispelling device further comprises two additional diodes, and the two additional diodes are in series with the second diode.

19. The semiconductor device as claimed in claim 11, wherein the charge-dispelling device comprises a metal line.

20. A semiconductor device of an integrated circuit (IC), comprising:

a deep n-well (DNW) in a substrate;

a first n-channel metal-oxide-semiconductor (NMOS) transistor formed inside the DNW, wherein a bulk and a source of the first NMOS transistor are connected;

a second NMOS transistor formed in the substrate and outside the DNW, wherein a bulk and a source of the second NMOS transistor are connected;

a charge-dispelling device, connected between the bulk of the first NMOS transistor and the bulk of the second NMOS transistor to develop a bypass path; and a metal line, arranged between a drain of the first NMOS transistor and a gate of the second NMOS transistor, and impedance of the bypass path is lower than impedance of the electrical path.

* * * * *